US011183631B2

(12) United States Patent
Chu et al.

(10) Patent No.: US 11,183,631 B2
(45) Date of Patent: Nov. 23, 2021

(54) ELECTRODE STRUCTURE TO IMPROVE RRAM PERFORMANCE

(71) Applicant: Taiwan Semiconductor Manufacturing Co., Ltd., Hsin-Chu (TW)

(72) Inventors: Wen-Ting Chu, Kaohsiung (TW); Tong-Chern Ong, Taipei (TW); Ying-Lang Wang, Tien-Chung Village (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/662,422

(22) Filed: Oct. 24, 2019

(65) Prior Publication Data

US 2020/0058858 A1  Feb. 20, 2020

Related U.S. Application Data

(63) Continuation of application No. 15/939,832, filed on Mar. 29, 2018, now Pat. No. 10,516,106.

(Continued)

(51) Int. Cl.
*H01L 45/00* (2006.01)
*H01L 27/24* (2006.01)

(52) U.S. Cl.
CPC .......... *H01L 45/1246* (2013.01); *H01L 45/08* (2013.01); *H01L 45/1233* (2013.01);
(Continued)

(58) Field of Classification Search
CPC .. H01L 45/08; H01L 45/1253; H01L 45/1266
See application file for complete search history.

(56) References Cited

U.S. PATENT DOCUMENTS 9,224,947 B1  12/2015 Chang et al.
9,577,191 B2   2/2017 Dang et al.
(Continued)

FOREIGN PATENT DOCUMENTS

WO      2018182649 A    10/2018

OTHER PUBLICATIONS

Carrasco, et al. "Bulk and Surface Oxygen Vacancy Formation and Diffusion in Single Crystals, Ultrathin films, and Metal Grown Oxide Structures." The Journal of Chemical Physics 125, 074711, 2006. Published on Aug. 21, 2006.
(Continued)

*Primary Examiner* — Cuong Q Nguyen
*Assistant Examiner* — Peter M Albrecht
(74) *Attorney, Agent, or Firm* — Eschweiler & Potashnik, LLC

(57) ABSTRACT

The present disclosure, in some embodiments, relates to a resistive random access memory (RRAM) device. The RRAM device includes a bottom electrode that is disposed over a lower interconnect layer surrounded by a lower inter-level dielectric (ILD) layer. A data storage structure is arranged over the bottom electrode and a multi-layer top electrode is disposed over the data storage structure. The multi-layer top electrode includes conductive top electrode layers separated by an oxygen barrier structure that is configured to mitigate movement of oxygen between the conductive top electrode layers. A sidewall spacer is disposed directly over the bottom electrode and has a sidewall that covers outermost sidewalls of the conductive top electrode layers and the oxygen barrier structure.

20 Claims, 10 Drawing Sheets

Related U.S. Application Data

(60) Provisional application No. 62/524,720, filed on Jun. 26, 2017.

(52) U.S. Cl.
CPC ........ H01L 45/1253 (2013.01); H01L 45/146 (2013.01); H01L 45/16 (2013.01); H01L 45/1608 (2013.01); *H01L 27/2436* (2013.01)

(56) References Cited

U.S. PATENT DOCUMENTS

| | | | |
|---|---|---|---|
| 10,109,793 B2 | 10/2018 | Yang et al. | |
| 2006/0108625 A1* | 5/2006 | Lee | G11C 13/00 257/310 |
| 2010/0038791 A1 | 2/2010 | Lee et al. | |
| 2010/0258782 A1* | 10/2010 | Kuse | H01L 45/1253 257/4 |
| 2014/0001429 A1 | 1/2014 | He et al. | |
| 2015/0287914 A1* | 10/2015 | Ho | H01L 45/146 257/4 |
| 2015/0295172 A1 | 10/2015 | Sung et al. | |
| 2016/0064664 A1 | 3/2016 | Dang et al. | |
| 2016/0218283 A1* | 7/2016 | Trinh | H01L 45/1675 |
| 2017/0117464 A1* | 4/2017 | Chen | H01L 45/1246 |
| 2017/0125673 A1 | 5/2017 | Hsu et al. | |
| 2017/0170394 A1* | 6/2017 | Chen | H01L 45/085 |
| 2017/0256711 A1 | 9/2017 | Chen et al. | |
| 2018/0269389 A1* | 9/2018 | Hsu | H01L 45/145 |

OTHER PUBLICATIONS

Ganduglia-Pirovano, et al. "Oxygen Vacancies in Transition Metal and Rare Earth Oxides: Current State of Understanding and Remaining Challenges." Surface Science Reports 62 (2007) 219-270.

Non-Final Office Action dated Jan. 30, 2019 for U.S. Appl. No. 15/939,832.

Final Office Action dated Jul. 25, 2019 for U.S. Appl. No. 15/939,832.

Notice of Allowance dated Oct. 31, 2019 for U.S. Appl. No. 15/939,832.

* cited by examiner

ELECTRODE STRUCTURE TO IMPROVE RRAM PERFORMANCE

REFERENCE TO RELATED APPLICATIONS

This application is a Continuation of U.S. application Ser. No. 15/939,832, filed on Mar. 29, 2018, which claims the benefit of U.S. Provisional Application No. 62/524,720, filed on Jun. 26, 2017. The contents of the above-referenced patent applications are hereby incorporated by reference in their entirety.

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology due to its simple structure and its compatibility with CMOS (complementary metal-oxide-semiconductor) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
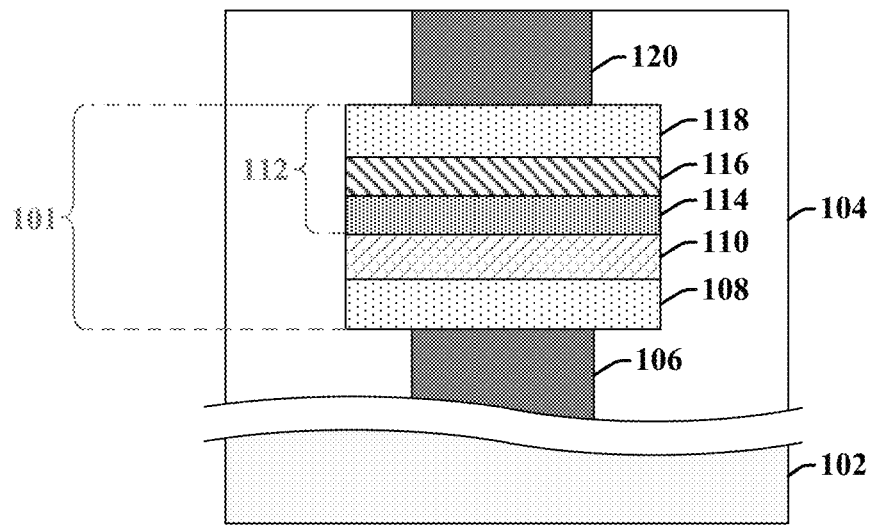
FIG. 1 illustrates a cross-sectional view of some embodiments of resistive random access memory (RRAM) device having an oxygen barrier structure configured to improve reliability.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

RRAM devices have a bottom electrode that is separated from an overlying top electrode by a dielectric data storage layer having a variable resistance. RRAM devices are configured to store data based on a resistive state of the dielectric data storage layer. For example, the dielectric data storage layer may have a high resistance state associated with a first data state (e.g., a '0') or a low resistance state associated with a second data state (e.g., a '1').

During operation of an RRAM device, bias voltages are applied to the bottom and top electrodes to reversibly change a resistive state of the dielectric data storage layer. The bias voltages change the resistive state of the dielectric data storage layer by controlling the movement of oxygen between the electrodes and the dielectric data storage layer to either form or break conductive filaments extending through the dielectric data storage layer. For example, a first set of bias voltages may induce conductive paths/filaments (e.g., chains of oxygen vacancies) to form across the dielectric data storage layer to achieve a low resistance state, while a second set of bias voltages may break conductive paths/filaments within the dielectric data storage layer to achieve a high resistance state.

It has been appreciated that when forming a conductive filament to achieve a low resistive state, the bias voltages may cause oxygen from the dielectric data storage layer to move to deep within a top electrode and/or within an overlying layer. However, if oxygen moves far away from the dielectric data storage layer it can be difficult to pull the oxygen back to dielectric data storage layer to subsequently break the conductive filament. As an RRAM device is operated over many cycles, the amount of oxygen moved to deep within the top electrode and/or the overlying layer increases, eventually leading to RRAM failure.

The present disclosure relates to a resistive random access memory (RRAM) device having an electrode comprising an oxygen barrier structure configured to improve RRAM reliability by maintaining oxygen within close proximity of a dielectric data storage layer, and an associated method of formation. In some embodiments, the RRAM device comprises a bottom electrode disposed over a lower interconnect layer surrounded by a lower inter-level dielectric (ILD) layer. A dielectric data storage layer having a variable resistance is located above the bottom electrode, and a multi-layer top electrode is disposed over the dielectric data storage layer. The multi-layer top electrode comprises conductive top electrode layers separated by an oxygen barrier structure configured to mitigate movement of oxygen within the multi-layer top electrode. By mitigating the movement of oxygen within the multi-layer top electrode, oxygen can be kept close to the dielectric data storage layer and a reliability of the RRAM device can be improved.

FIG. 1 illustrates a cross-sectional view of some embodiments of an integrated chip 100 comprising a resistive random access memory (RRAM) device having an oxygen barrier structure configured to improve reliability.

The integrated chip 100 comprises an RRAM device 101 surrounded by an inter-level dielectric (ILD) structure 104 arranged over a substrate 102. The RRAM device 101 comprises a bottom electrode 108, a dielectric data storage layer 110, and a multi-layer top electrode 112. The bottom electrode 108 is separated from the substrate 102 by one or more lower interconnect layers 106 (e.g., a metal via and/or a metal wire). The dielectric data storage layer 110 is arranged over the bottom electrode 108 and the multi-layer top electrode 112 is disposed between the dielectric data storage layer 110 and an upper interconnect layer 120 (e.g., a metal via and/or a metal wire).

The dielectric data storage layer 110 is configured to store data states by undergoing reversible changes between a high resistance state associated with a first data state (e.g., a '0') and a low resistance state associated with a second data state (e.g., a '1'). For example, to achieve a low resistance state within the dielectric data storage layer 110, a first set of bias conditions may be applied to the bottom electrode 108 and the multi-layer top electrode 112. The first set of bias conditions drive oxygen from dielectric data storage layer 110 to the multi-layer top electrode 112, thereby forming conductive filaments of oxygen vacancies across the dielectric data storage layer 110. Alternatively, to achieve a high resistance state within the dielectric data storage layer 110, a second set of bias conditions may be applied to the bottom electrode 108 and the multi-layer top electrode 112. The second set of bias conditions break the conductive filaments by driving oxygen from the multi-layer top electrode 112 to the dielectric data storage layer 110.

The multi-layer top electrode 112 comprises conductive top electrode layers separated by an oxygen barrier structure comprising one or more oxygen barrier layers. The oxygen barrier structure is configured to improve reliability of the RRAM device 101 by mitigating the movement of oxygen (e.g., oxygen ions) and thereby maintaining a large concentration of oxygen (e.g., oxygen ions) within close proximity of the dielectric data storage layer 110. By maintaining the large concentration of oxygen within close proximity of the dielectric data storage layer 110, oxygen can be easily pulled back to the dielectric data storage layer 110 to achieve a high resistance state.

For example, in some embodiments, the multi-layer top electrode 112 may comprise a lower top electrode layer 114, an oxygen barrier structure 116, and an upper top electrode layer 118. The lower top electrode layer 114 is separated from the upper top electrode layer 118 by the oxygen barrier structure 116, which is configured to mitigate movement of oxygen from the lower top electrode layer 114 to the upper top electrode layer 118. By using the oxygen barrier structure 116 to mitigate movement of oxygen from the lower top electrode layer 114 to the upper top electrode layer 118, oxygen that is driven out of the dielectric data storage layer 110 (e.g., when writing a low resistance state to the RRAM device 101) is kept close to the dielectric data storage layer 110. This allows for the oxygen to be more easily brought back to the dielectric data storage layer 110 (e.g., when writing a high resistance state to the RRAM device 101), thereby improving reliability of switching between data states.

Figure 2:
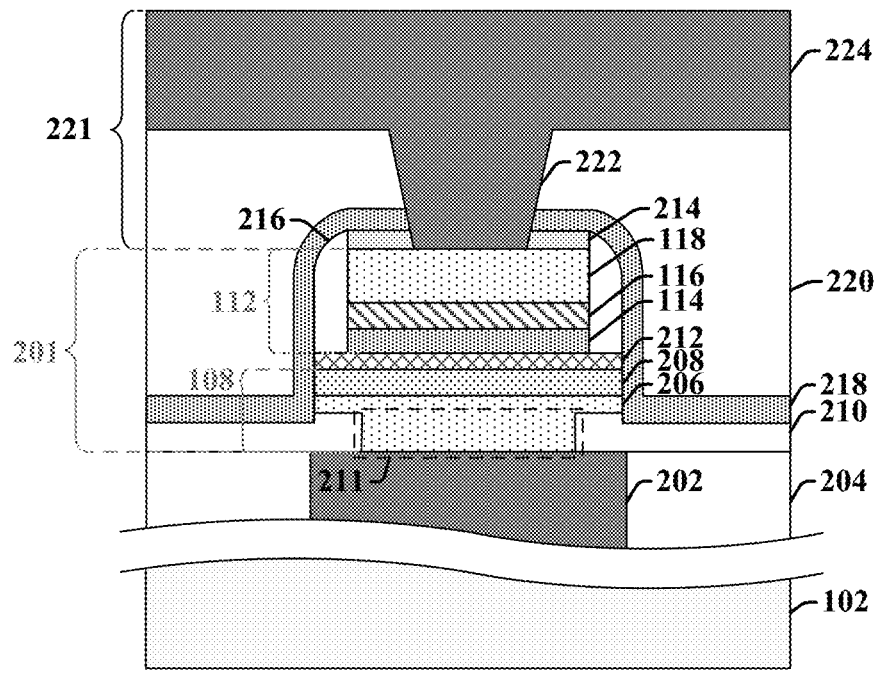
FIG. 2 illustrates a cross-sectional view of some embodiments of RRAM device having a multi-layer top electrode comprising an oxygen barrier structure.

FIG. 2 illustrates a cross-sectional view of some embodiments of an integrated chip 200 comprising an RRAM device having a top electrode comprising an oxygen barrier structure configured to improve reliability.

The integrated chip 200 comprises an RRAM device 201 arranged over a lower interconnect layer 202. The lower interconnect layer 202 is surrounded by a lower inter-level dielectric (ILD) layer 204. In some embodiments, the lower interconnect layer 202 may comprise one of a plurality of interconnect layers (e.g., metal wires, vias, etc.) disposed between the RRAM device 201 and an underlying substrate 102. The lower interconnect layer 202 may comprise a conductive metal such as copper, aluminum, and/or tungsten, for example. A lower dielectric layer 210 is located over opposing sides of the lower interconnect layer 202. The lower dielectric layer 210 defines a cavity 211 that extends through the lower dielectric layer 210 to the lower interconnect layer 202.

The RRAM device 201 comprises a bottom electrode 108, a dielectric data storage layer 212 having a variable resistance, and a multi-layer top electrode 112. The bottom electrode 108 is arranged within the cavity 211 and over the lower dielectric layer 210. In some embodiments, the bottom electrode 108 may comprise a first bottom electrode layer 206 and a second bottom electrode layer 208. The first bottom electrode layer 206 comprises a non-planar lower surface having a protrusion extending through the cavity 211 to contact the lower interconnect layer 202. In some embodiments, the first bottom electrode layer 206 may comprise a diffusion barrier layer. The second bottom electrode layer 208 is arranged over the first bottom electrode layer 206. In some embodiments, the first bottom electrode layer 206 may comprise tantalum nitride (TaN) while the second bottom electrode layer 208 may comprise titanium nitride (TiN).

The dielectric data storage layer 212 is located over the bottom electrode 108. In some embodiments, the dielectric data storage layer 212 may directly contact the bottom electrode 108. The dielectric data storage layer 212 comprises a high-k dielectric material having a variable resistance. In various embodiments, the dielectric data storage layer 212 may comprise a single or composite film of hafnium oxide (HfOx), nickel oxide (NiOx), tantalum oxide ($Ta_yOx$), titanium oxide (TiOx), tungsten oxide (WOx), zirconium oxide (ZrOx), and/or other similar materials.

The multi-layer top electrode 112 is positioned over the dielectric data storage layer 212. The multi-layer top electrode 112 comprises a lower top electrode layer 114, an oxygen barrier structure 116 arranged over the lower top electrode layer 114, and an upper top electrode layer 118 arranged over the oxygen barrier structure 116. The oxygen barrier structure 116 is configured to mitigate movement of oxygen (e.g., oxygen ions) through the multi-layer top electrode 112 during operation of the RRAM device 102. For example, the oxygen barrier structure 116 may provide for the lower top electrode layer 114 to have a greater oxygen concentration than the upper top electrode layer 118. In some embodiments, the oxygen barrier structure 116 may result in the formation of a gradient oxygen concentration profile within the multi-layer top electrode 112 that decreases (e.g., monotonically decreases) from the lower top electrode layer 114 to the upper top electrode layer 118. In some embodiments, the oxygen barrier structure 116 continuously extends between a lower surface contacting an upper surface of the lower top electrode layer 114 and an upper surface contacting a bottom surface of the upper top electrode layer 118.

In some embodiments, the lower top electrode layer 114 may comprise a metal, such as titanium (Ti) or tantalum (Ta). The oxygen barrier structure 116 comprises one or more metal oxide and/or metal oxynitride layers. In some embodiments, metal oxide and/or the metal oxynitride layers may comprise one or more of titanium oxide (TiO), tantalum oxide (TaO), zirconium oxide (ZrO), hafnium oxide (HfO), titanium oxynitride (TiON), tantalum oxynitride (TaON), and indium tin oxide (ITO). The upper top electrode layer 118 comprises a metal nitride, such as titanium nitride (TiN) or tantalum nitride (TaN).

In some embodiments, the lower top electrode layer 114 and the oxygen barrier structure 116 may comprise a same metal. For example, in some embodiments, the lower top electrode layer 114 may comprise titanium and the oxygen barrier structure 116 may comprise titanium oxide or titanium oxynitride. In other embodiments, the lower top electrode layer 114 and the oxygen barrier structure 116 may comprise different metals. For example, in some embodiments, the lower top electrode layer 114 may comprise titanium and the oxygen barrier structure 116 may comprise hafnium oxide. In various embodiments, the upper top electrode layer 118 may comprise a metal that is the same as the lower top electrode layer 114 or a metal that is different than the lower top electrode layer 114.

A masking layer 214 may be disposed over the multi-layer top electrode 112. In some embodiments, the masking layer 214 may comprise a silicon oxy-nitride (SiON) hard mask layer, a silicon dioxide (SiO$_2$) hard mask layer, or a PE-SiN hard mask. In some embodiments, sidewall spacers 216 are disposed on opposing sides of the multi-layer top electrode 112 and the masking layer 214. An upper ILD layer 220 is disposed over the masking layer 214 at a position surrounding an upper interconnect layer 221 disposed onto the multi-layer top electrode 112. The upper interconnect layer 221 comprises an upper metal via 222, which extends through the masking layer 214 from the multi-layer top electrode 112 to an upper metal wire 224.

In some embodiments, an upper dielectric layer 218 is disposed over the RRAM device 201. The upper dielectric layer 218 continuously extends from a first position abutting a top surface of the masking layer 214 to a second position abutting an upper surface of the lower dielectric layer 210. The upper dielectric layer 218 separates the RRAM device 201 from the upper ILD layer 220. In some embodiments, the upper dielectric layer 218 may comprise a silicon nitride or a silicon oxide, for example.

Figure 3A:
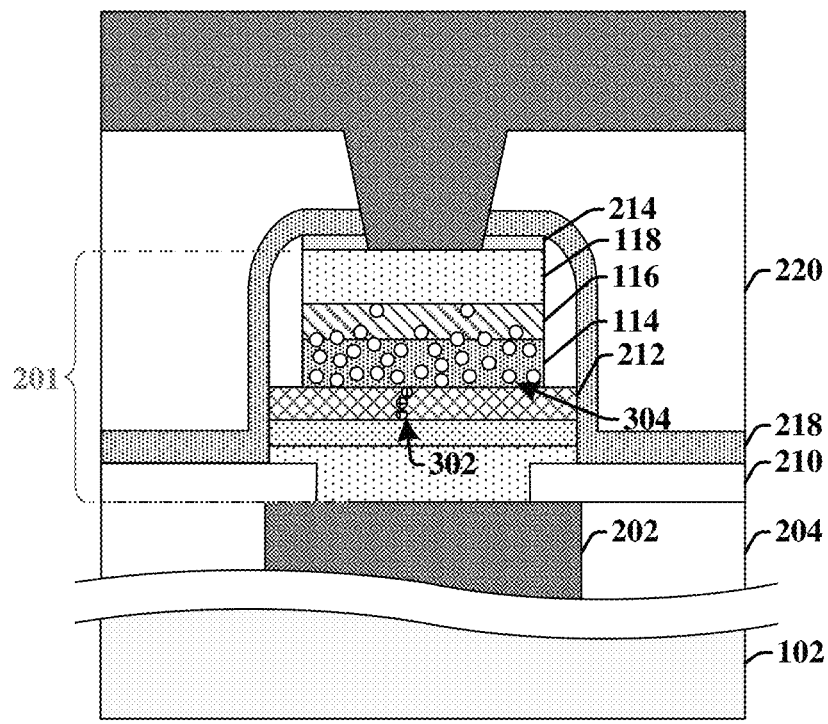
FIGS. 3A-3B illustrate cross-sectional views of some embodiments of RRAM device having a multi-layer top electrode comprising an oxygen barrier structure.
Figure 3B:
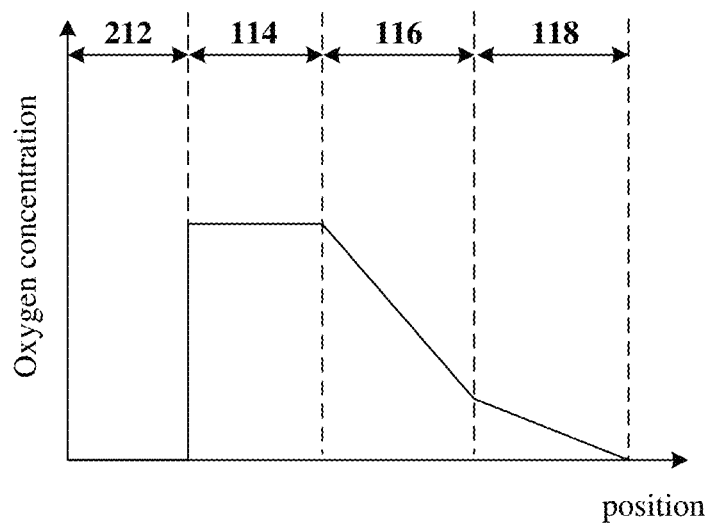

FIGS. 3A-3B illustrate some embodiments of an integrated chip comprising an RRAM device having a top electrode comprising an oxygen barrier structure configured to mitigate movement of oxygen.

As shown in cross-sectional view 300 of FIG. 3A, when an RRAM device 201 is in a low resistance state a conductive filament 302 extends through a dielectric state storage layer 212 and oxygen ions 304 (e.g., O$^{2-}$ ions) are present in the lower top electrode layer. Within the lower top electrode layer 114, the oxygen ions 304 can move freely (e.g., with the movement of free electrons). However, the oxygen ions 304 are not able to move freely within the oxygen barrier structure 116 since it is an insulator. Therefore, during formation of the conductive filament 302, the oxygen barrier structure 116 mitigates the movement of the oxygen ions 304 away from the dielectric data storage layer 212, so as to maintain a higher concentration of oxygen ions 304 within the lower top electrode layer 114 than within the oxygen barrier structure 116.

FIG. 3B illustrates a graph 306 showing the oxygen ion concentration (y-axis) as a function of position (x-axis) over the multi-layer top electrode. As shown in graph 306, the oxygen ion concentration within the lower top electrode layer is greater than the oxygen ion concentration within the upper top electrode layer 118. This is because oxygen ions (304 of FIG. 3A) are prevented from moving into the upper top electrode layer 118 by the oxygen barrier structure 116.

Figure 4:
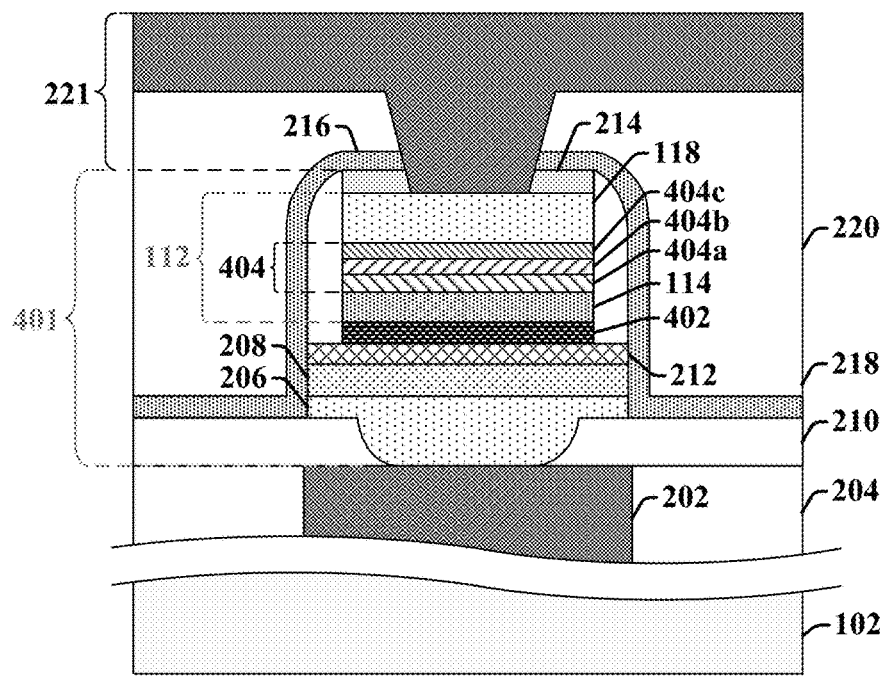
FIG. 4 illustrates a cross-sectional view of some additional embodiments of RRAM device having a multi-layer top electrode comprising an oxygen barrier structure.

FIG. 4 illustrates a cross-sectional view of some additional embodiments of an integrated chip 400 comprising an RRAM device having a top electrode comprising an oxygen barrier structure configured to mitigate movement of oxygen.

The integrated chip 400 comprises an RRAM device 401 having a multi-layer top electrode 112. The multi-layer top electrode 112 comprises a lower top electrode layer 114, an oxygen barrier structure 404, and an upper top electrode layer 118. The oxygen barrier structure 404 comprises a plurality of oxygen barrier layers 404a-404c arranged over the lower top electrode layer 114. The plurality of oxygen barrier layers 404a-404c comprise metal oxides and/or metal oxynitrides. In some embodiments, the plurality of oxygen barrier layers 404a-404c may comprise two or more different metal oxides and/or metal oxynitrides. For example, a first oxygen barrier layer 404a may comprise titanium nitride, a second oxygen barrier layer 404b may comprise hafnium oxynitride, etc. In some embodiments, the first oxygen barrier layer 404a may comprise a native oxide layer directly contacting the lower top electrode layer 114 (e.g., a titanium oxide layer arranged directly onto a lower top electrode layer 114 comprising titanium).

In some embodiments, a capping layer 402 may be disposed between a dielectric data storage layer 212 and the oxygen barrier structure 404. The capping layer 402 is configured to store oxygen, which can facilitate resistance changes within the dielectric data storage layer 212. In some embodiments, the capping layer 402 may comprise a metal or a metal oxide that is relatively low in oxygen concentration. For example, in some embodiments, the capping layer 402 may comprise a metal such as titanium (Ti), hafnium (Hf), platinum (Pt), and/or aluminum (Al). In other embodiments, the capping layer 402 may comprise a metal oxide such as titanium oxide (TiO), hafnium oxide (HfO), zirconium oxide (ZrO), germanium oxide (GeO), cerium oxide (CeO).

Figure 5:
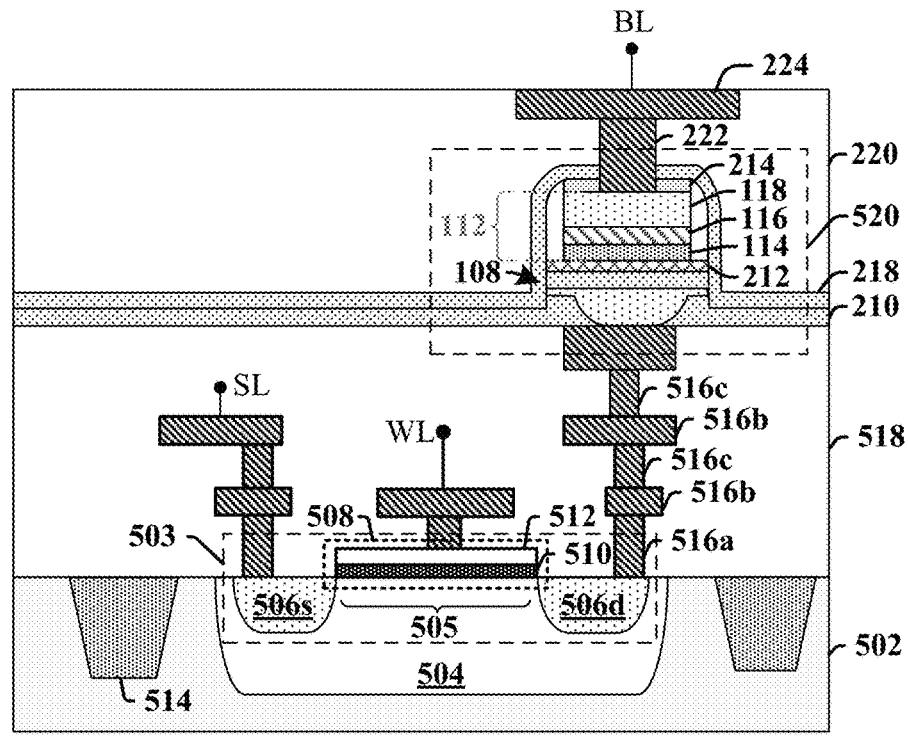
FIG. 5 illustrates a cross-sectional view of some embodiments of an integrated chip having a multi-layer top electrode comprising an oxygen barrier structure.

FIG. 5 illustrates a cross-sectional view of some embodiments of an integrated chip 500 comprising an RRAM device having a top electrode comprising an oxygen barrier structure configured to block movement of oxygen.

The integrated chip 500 comprises a well region 504 disposed within a semiconductor substrate 502. A transistor 503 is arranged within the well region 504. The transistor 503 comprises a source region 506s that is separated from a drain region 506d by a channel region 505. A gate structure 508 is arranged over the channel region 505. The gate structure 508 comprises a gate electrode 512 separated from the channel region 505 by a gate dielectric layer 510. In some embodiments, the transistor 503 may be arranged between isolation regions 514 (e.g., shallow trench isolation regions) within the semiconductor substrate 502.

A first ILD structure 518 is arranged over the semiconductor substrate 502. In some embodiments, the first ILD structure 518 may comprise one or more layers of an oxide, a low-k dielectric, or an ultra low-k dielectric. A plurality of interconnect layers including contacts 516a, metal wire layers 516b, and metal via layers 516c are surrounded by the first ILD structure 518. In some embodiments, the plurality of contacts 516a, metal wire layers 516b, and metal via layers 516c may comprise copper, tungsten, and/or aluminum. The metal wire layers 516b comprise a source-line SL comprising a first interconnect wire that is electrically coupled to the source region 506s. In some embodiments, the source-line SL may be arranged in a second metal wire layer that is connected to the source region 506s through a contact, a first metal wire layer, and a first metal via layer. The metal wire layers 516b further comprise a word-line WL comprising a second interconnect wire that is electrically coupled to the gate electrode 512. In some embodiments, the word-line WL may be arranged in the first metal wire layer that is connected to the gate electrode 512 by way of a contact.

An RRAM device 520 is arranged over the first ILD structure 518. The RRAM device 520 comprises a bottom electrode 108 that is vertically separated from the first ILD structure 518 by a lower dielectric layer 210. The bottom electrode 108 is directly connected to the drain region 506d by the plurality of interconnect layers. The RRAM device 520 further comprises a dielectric data storage layer 212 located over the bottom electrode 108, and a multi-layer top electrode 112 disposed over the dielectric data storage layer 212. The multi-layer top electrode 112 comprises a lower top electrode layer 114, an oxygen barrier structure 116, and an upper top electrode layer 118. In some embodiments, a masking layer 214 may be arranged onto the multi-layer top electrode 112. An upper dielectric layer 218 continuously extends from a position abutting a top of the masking layer 214 to positions abutting an upper surface of the lower dielectric layer 210. The upper dielectric layer 218 separates the RRAM device 520 from a second ILD layer 220 surrounding an upper metal via 222 and an upper metal wire 224.

FIGS. 6-15 illustrate some embodiments of cross-sectional views showing a method of forming a RRAM device having an oxygen barrier structure configured to mitigate movement of oxygen. Although FIGS. 6-15 are described in relation to a method, it will be appreciated that the structures disclosed in FIGS. 6-15 are not limited to such a method, but instead may stand alone as structures independent of the method.

Figure 6:
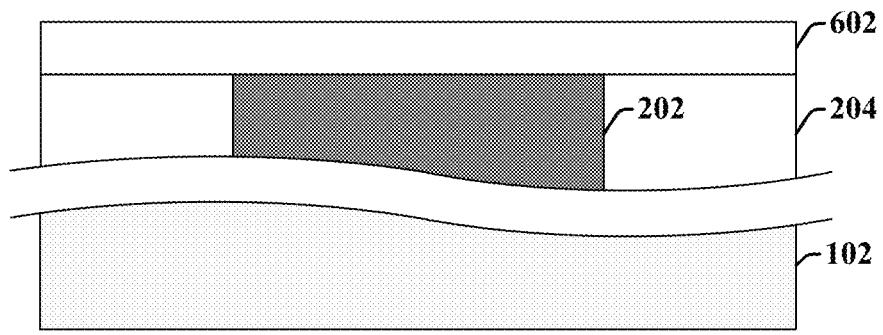
FIGS. 6-15 illustrate some embodiments of cross-sectional views showing a method of forming a RRAM device having a multi-layer top electrode comprising an oxygen barrier structure.

As shown in cross-sectional view 600 of FIG. 6, a lower interconnect layer 202 is formed within a lower inter-level dielectric (ILD) layer 204 over a substrate 102. The substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the lower interconnect layer 202 may be formed by selectively etching the lower ILD layer 204 (e.g., an oxide, a low-k dielectric, or an ultra low-k dielectric) to define an opening within the lower ILD layer 204. A metal (e.g., copper, aluminum, etc.) is then deposited to fill the opening, and a planarization process (e.g., a chemical mechanical planarization process) is performed to remove excess metal.

A lower dielectric layer 602 is formed onto the lower interconnect layer 202 and the lower ILD layer 204. In some embodiments, the lower dielectric layer 602 may comprise silicon-nitride (SiN), silicon-carbide (SiC), or a similar composite dielectric film. In some embodiments, the lower dielectric layer 602 may be formed by a deposition technique (e.g., physical vapor deposition (PVD), chemical vapor deposition (CVD), PE-CVD, atomic layer deposition (ALD), sputtering, etc.) to a thickness in a range of between approximately 200 angstroms and approximately 300 angstroms.

Figure 7:
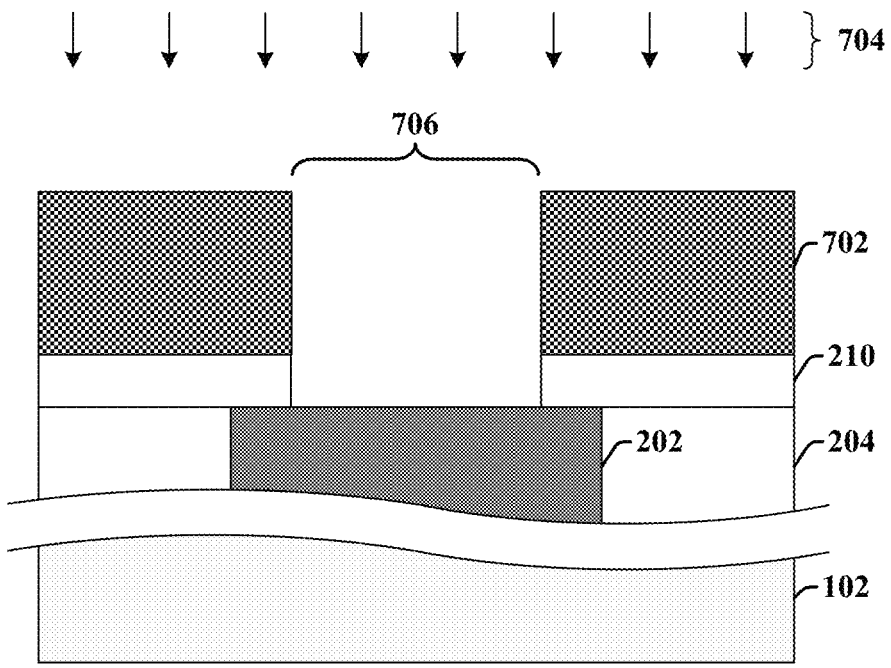

As shown in cross-sectional view 700 of FIG. 7, a first masking layer 702 is formed over the lower dielectric layer (602 of FIG. 6). The lower dielectric layer (602 of FIG. 6) is then selectively exposed to an etchant 704 (e.g., a dry etchant) in areas not covered by the first masking layer 702. The etchant 704 defines an opening 706 in the lower dielectric layer 210, which extends through the lower dielectric layer 210 to the lower interconnect layer 202.

Figure 8:
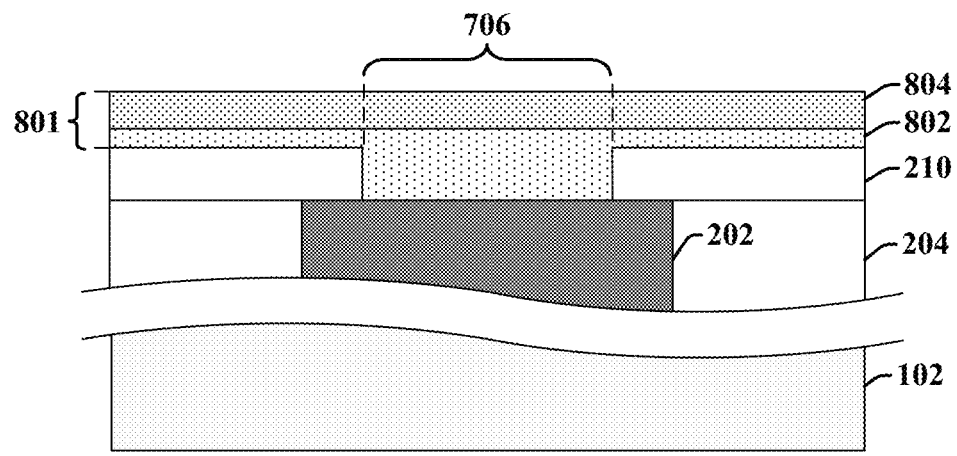

As shown in cross-sectional view 800 of FIG. 8, a bottom electrode structure 801 is formed over the lower interconnect layer 202 and the lower dielectric layer 210. In some embodiments, the bottom electrode structure 801 is formed by forming a first bottom electrode film 802 and subsequently forming a second bottom electrode film 804 over the first bottom electrode film 802.

The first bottom electrode film 802 extends from within the opening 706 to a position overlying the lower dielectric layer 210. In some embodiments, the first bottom electrode film 802 may comprise tantalum nitride (TaN) or titanium nitride (TiN), for example. A planarization process (e.g., a chemical mechanical planarization process) may subsequently be performed. In some embodiments, the planarization process results in the first bottom electrode film 802 having a thickness in a range of between approximately 100 angstroms and approximately 300 angstroms over the lower dielectric layer 210. The second bottom electrode film 804 is formed over the first bottom electrode film 802. In some embodiments, the second bottom electrode film 804 may comprise tantalum (Ta) or titanium (Ti). In some embodiments, the second bottom electrode film 804 may be formed to a thickness in a range of between approximately 100 angstroms and approximately 200 angstroms.

Figure 9:
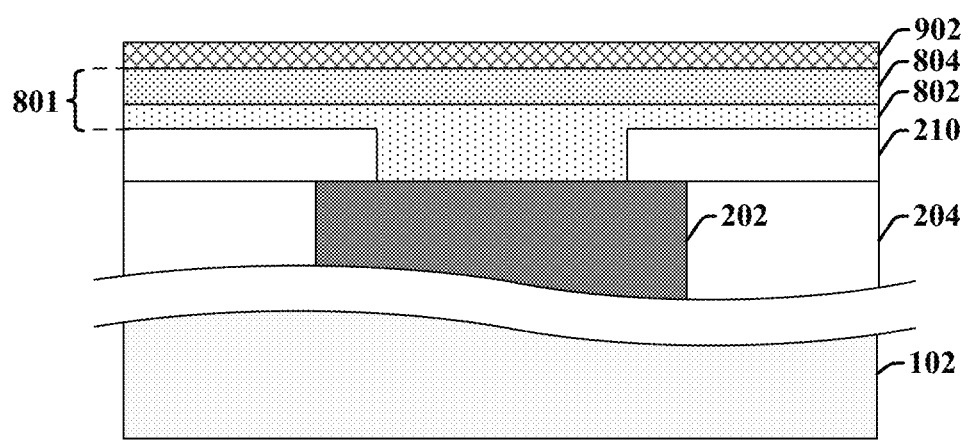

As shown in cross-sectional view 900 of FIG. 9, a dielectric data storage film 902 is formed over the bottom electrode structure 801. In some embodiments, the dielectric data storage film 902 may comprise a high-k dielectric material having a variable resistance. For example, in some embodiments, the dielectric data storage film 902 may comprise hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$). In some embodiments, the dielectric data storage film 902 may be formed to a thickness in a range of between approximately 25 angstroms and approximately 75 angstroms.

Figure 10A:
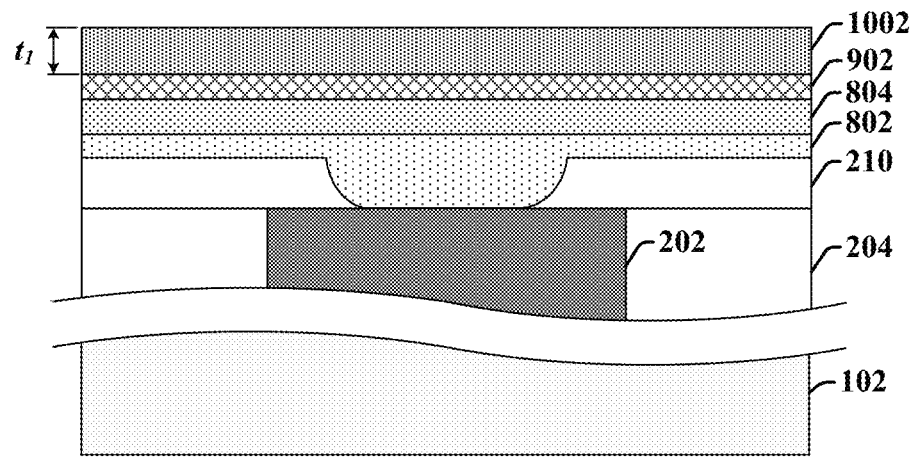

As shown in cross-sectional view 1000 of FIG. 10A, a lower top electrode film 1002 is formed over the dielectric data storage film 902. In some embodiments, the lower top electrode film 1002 may comprise a metal, such as titanium (Ti) or tantalum (Ta). In some embodiments, the lower top electrode film 1002 may be formed by way of a deposition technique (e.g., PVD, CVD, PE-CVD, sputtering, ALD, etc.). The lower top electrode film 1002 has a first thickness $t_1$. In some embodiments, the first thickness $t_1$ may be in a range of between approximately 50 angstroms and approximately 150 angstroms.

Figure 10B:
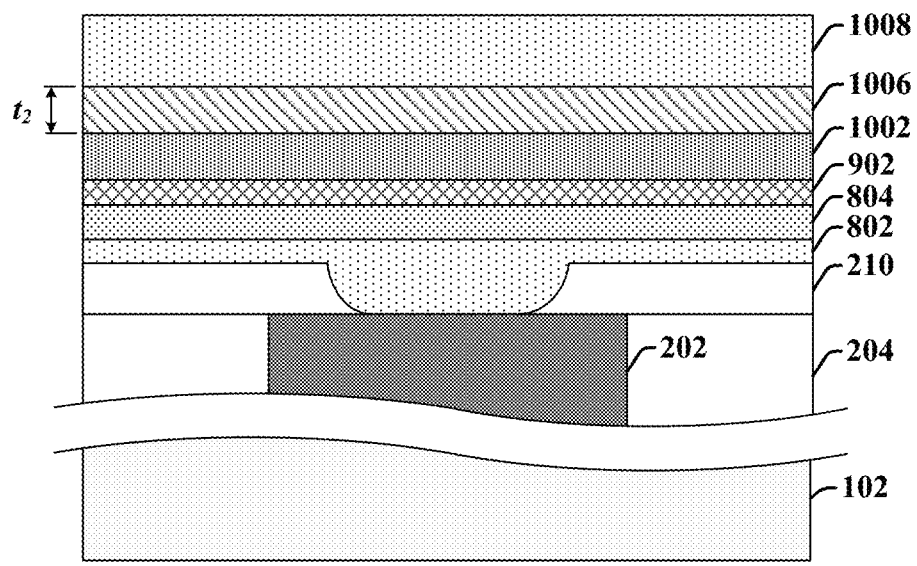

As shown in cross-sectional view 1004 of FIG. 10B, one or more oxygen barrier films 1006 are formed onto the lower top electrode film 1002. In various embodiments, the one or more oxygen barrier films 1006 may comprise metal oxide and/or metal oxynitride films. For example, in various embodiments, the one or more oxygen barrier films 1006 may comprise one or more of titanium oxide (TiO), tantalum oxide (TaO), zirconium oxide (ZrO), hafnium oxide (HfO), titanium oxynitride (TiON), tantalum oxynitride (TaON), and indium tin oxide (ITO).

In some embodiments, the one or more oxygen barrier films 1006 may comprise a same metal as the lower top electrode film 1002. For example, in some embodiments, the lower top electrode film 1002 may comprise titanium and the one or more oxygen barrier films 1006 may comprise titanium oxide and/or titanium oxynitride. In other embodiments, the one or more oxygen barrier films 1006 may comprise a different metal than the lower top electrode film 1002. In some embodiments, the one or more oxygen barrier films 1006 may have a cumulative thickness that is in a range of between approximately 5 angstroms and approximately 150 angstroms. In other embodiments, the one or more oxygen barrier films 1006 may have a cumulative thickness that is in a range of between approximately 50 angstroms and approximately 150 angstroms. Having a cumulative thickness of greater than 5 angstroms allows for the one or more oxygen barrier films 1006 to mitigate the movement of oxygen away from the dielectric data storage film 902. Moreover, having a cumulative thickness of less than 150 angstroms allows for oxygen to be maintained within close proximity of the dielectric data storage film 902 during operation of a memory device.

After formation of the one or more oxygen barrier films 1006, an upper top electrode film 1008 is formed onto the one or more oxygen barrier films 1006. In various embodiments, the upper top electrode film 1008 may comprise a metal nitride (e.g., titanium nitride (TiN) or tantalum nitride (TaN)) or a metal (e.g., titanium (Ti) or tantalum (Ta)). In some embodiments, the upper top electrode film 1008 may be deposited by way of a deposition technique (e.g., PVD, CVD, PE-CVD, sputtering, ALD, etc.) to a thickness greater than that of the lower top electrode film 1002.

In some embodiments, the one or more oxygen barrier films 1006 may be formed by way of deposition techniques (e.g., PVD, CVD, PE-CVD, sputtering, ALD, etc.). In such embodiments, the formation of the one or more oxygen barrier films 1006 does not substantially reduce a thickness of the lower top electrode film 1002 (i.e., a second thickness $t_2$ have a thickness of within 5 nm or less of the first thickness $t_1$). In some embodiments, the lower top electrode film 1002 and the one or more oxygen barrier films 1006 may be deposited in-situ (e.g., without breaking a vacuum on a processing chamber). In such embodiments, the first thickness $t_1$ is equal to the second thickness $t_2$. In other embodiments, the lower top electrode film 1002 and the one or more oxygen barrier films 1006 may be formed ex-situ. In some such embodiments, a bottommost film of the one or more oxygen barrier films 1006 may comprise a native oxide formed onto the lower top electrode film 1002 and additional oxygen barrier films overlying the native oxide. In various embodiments, the additional oxygen barrier films may comprise same or different metals as the native oxide.

In other embodiments, the one or more oxygen barrier films 1006 may be formed by way of a plasma oxidation process and/or a plasma nitridation process. The plasma oxidation process may be used to form an oxygen barrier film comprising a metal oxide by exposing the lower top electrode film 1002 to an oxygen plasma formed by igniting a plasma from oxygen molecules (e.g., $O_2$ gas). The plasma nitridation process may be used to form an oxygen barrier film comprising a metal oxynitride by exposing a metal oxide film on lower top electrode film 1002 to a nitrogen plasma formed by igniting a plasma from nitrogen molecules (e.g., $N_2$ gas). In some embodiments, the oxygen and/or nitrogen plasma may be formed using a plasma generation component comprising an RF power supply and an RF antenna. The RF power supply is configured to generate an RF signal operating at a set frequency (e.g., 13.56 MHz), which transfers energy from the RF power supply, via the RF antenna, to a gas within a processing chamber. When sufficient power has been delivered to the gas, the plasma is ignited.

The formation of the one or more oxygen barrier films 1006 by way of a plasma oxidation process and/or a plasma nitridation process consumes a part of the lower top electrode film 1002, thereby reducing a thickness of the lower top electrode film 1002 from the first thickness $t_1$ to a second thickness $t_2$ that is less than the first thickness $t_1$. The resulting one or more oxygen barrier films 1006 comprise a same metal (e.g., Ti or Ta) as the lower top electrode film 1002 along an interface between a lowermost one of the one or more oxygen barrier films 1006 and the lower top electrode film 1002.

Figure 11:
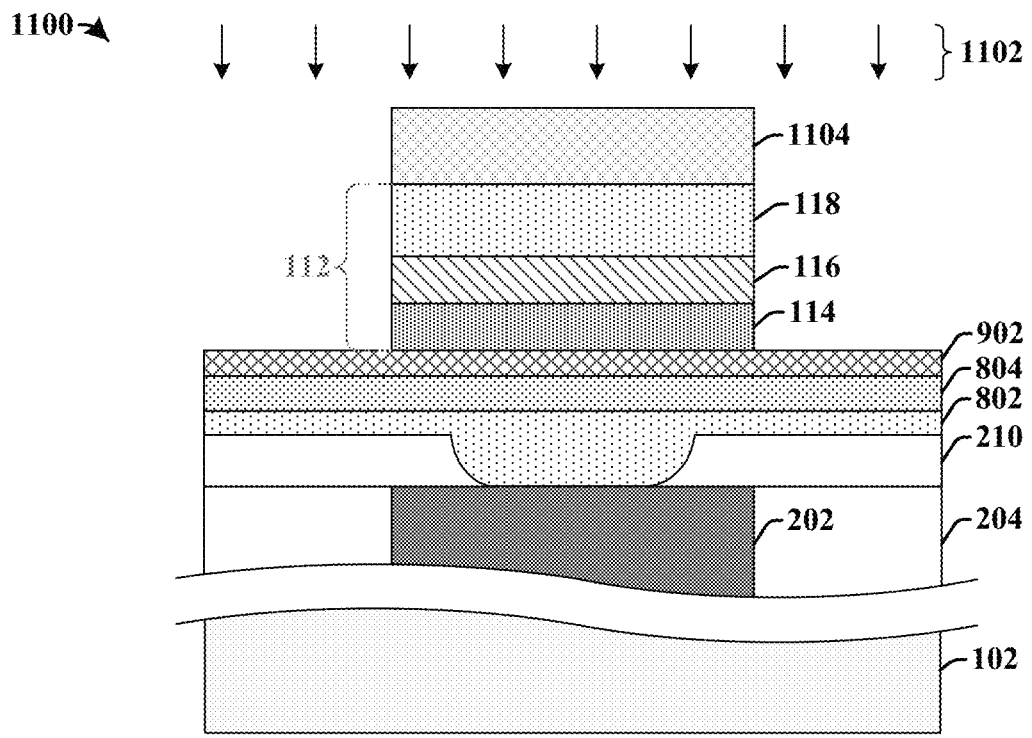

As shown in cross-sectional view 1100 of FIG. 11, a first patterning process is performed to define a multi-layer top electrode 112. In some embodiments, the first patterning process comprises forming a masking layer 1104 over the upper top electrode film (1008 of FIG. 10A). In various embodiments, the masking layer 1104 may comprise silicon-oxide ($SiO_2$), silicon-oxynitride (SiON), silicon-nitride (SiN) silicon-carbide (SiC), or a similar material. The substrate is then exposed to a first etchant 1102, configured to define the multi-layer top electrode 112 by selectively removing unmasked parts of the upper top electrode film (1008 of FIG. 10A), the one or more oxygen barrier films (1006 of FIG. 10A), and the lower top electrode film (1002 of FIG. 10A). In some embodiments, the first etchant 1102 may comprise a dry etchant.

In some embodiments, the first patterning process may reduce a thickness of the masking layer 1104. For example, in some embodiments, the first patterning process may reduce a thickness of the masking layer by a range of between approximately 70% and approximately 85% (e.g., from approximately 550 angstroms to approximately 100 angstroms).

Figure 12:
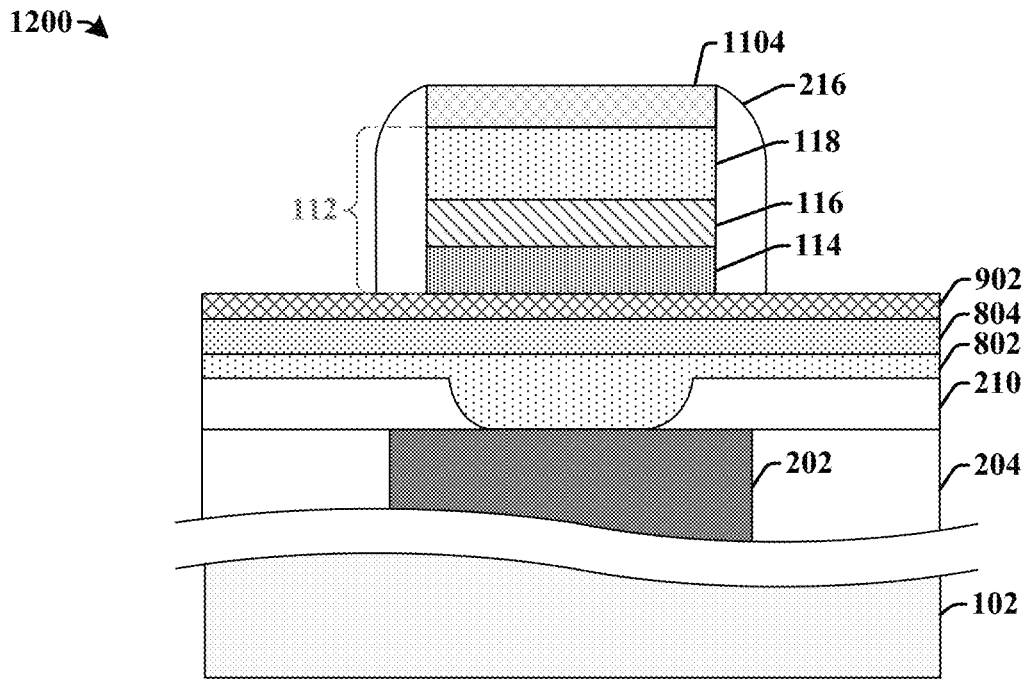

As shown in cross-sectional view 1200 of FIG. 12, sidewall spacers 216 may be formed on opposing sides of the multi-layer top electrode 112. In some embodiments, the sidewall spacers 216 may be formed by depositing a spacer layer onto the dielectric data storage film 902, the multi-layer top electrode 112, and the masking layer 1104. In some embodiments, the spacer layer may be deposited by a deposition technique (e.g., PVD, CVD, PE-CVD, ALD, sputtering, etc.) to a thickness in a range of between approximately 400 angstroms and approximately 600 angstroms. The spacer layer is subsequently etched to remove the spacer layer from horizontal surfaces, leaving the spacer layer along opposing sides of the multi-layer top electrode 112 as the sidewall spacers 216. In various embodiments, the spacer layer may comprise silicon nitride, a silicon dioxide ($SiO_2$), silicon oxy-nitride (e.g., SiON), or a similar material.

Figure 13:
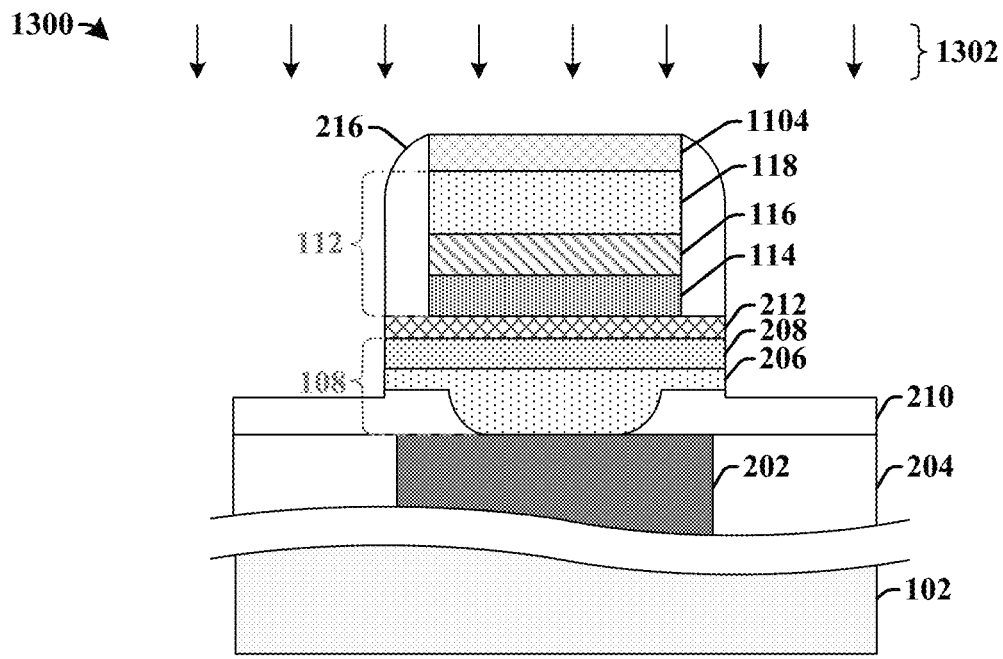

As shown in cross-sectional view 1300 of FIG. 13, a second patterning process is performed to define a dielectric data storage layer 212 and a bottom electrode 108. In some embodiments, the second patterning process selectively exposes the dielectric data storage film (902 of FIG. 12), the first bottom electrode film (802 of FIG. 12), and the second bottom electrode film (804 of FIG. 12) to a second etchant 1302 according to a mask comprising the masking layer 1104 and the sidewall spacers 216. The second etchant 1302 is configured to define the bottom electrode 108 and the dielectric data storage layer 212 by removing unmasked parts of the dielectric data storage film (902 of FIG. 12), the first bottom electrode film (802 of FIG. 12), and the second bottom electrode film (804 of FIG. 12). In some embodiments, the second etchant 1302 may comprise a dry etchant.

In some embodiments, the second patterning process may reduce a thickness of unmasked regions of the lower dielectric layer 210. For example, in some embodiments, the second patterning process may reduce a thickness of the unmasked regions of the lower dielectric layer 210 by a range of between approximately 20% and approximately 35% (e.g., from approximately 270 angstroms to approximately 220 angstroms). Reducing the thickness of the unmasked regions of the lower dielectric layer 210 causes the lower dielectric layer 210 to have a greater thickness below the bottom electrode 108 than outside of the bottom electrode 108.

Figure 14:
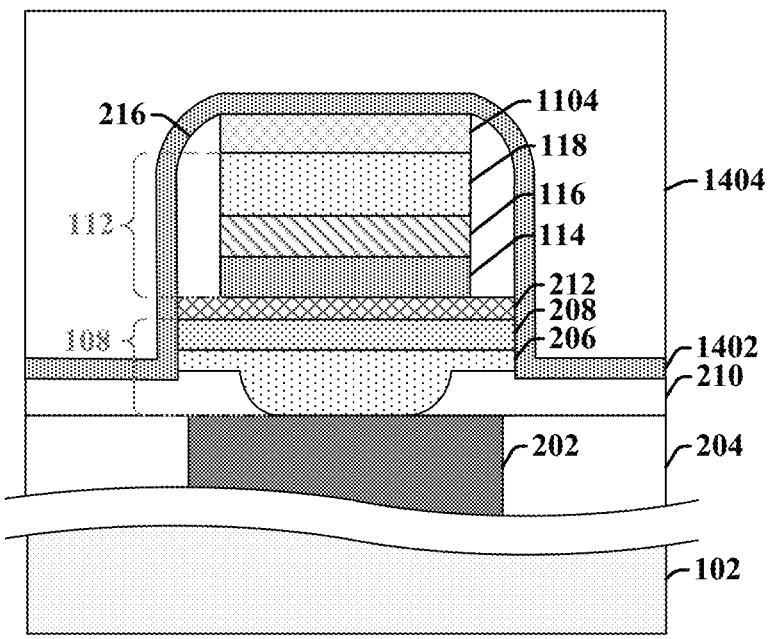

As shown in cross-sectional view 1400 of FIG. 14, an upper dielectric layer 1402 is formed over the substrate. An upper inter-level dielectric (ILD) layer 1404 is subsequently formed over the upper dielectric layer 1402. The upper dielectric layer 1402 has a first side that abuts the bottom electrode 108, the dielectric data storage layer 212, the multi-layer top electrode 112, and the masking layer 1104, and a second side that abuts the upper ILD layer 1404.

Figure 15:
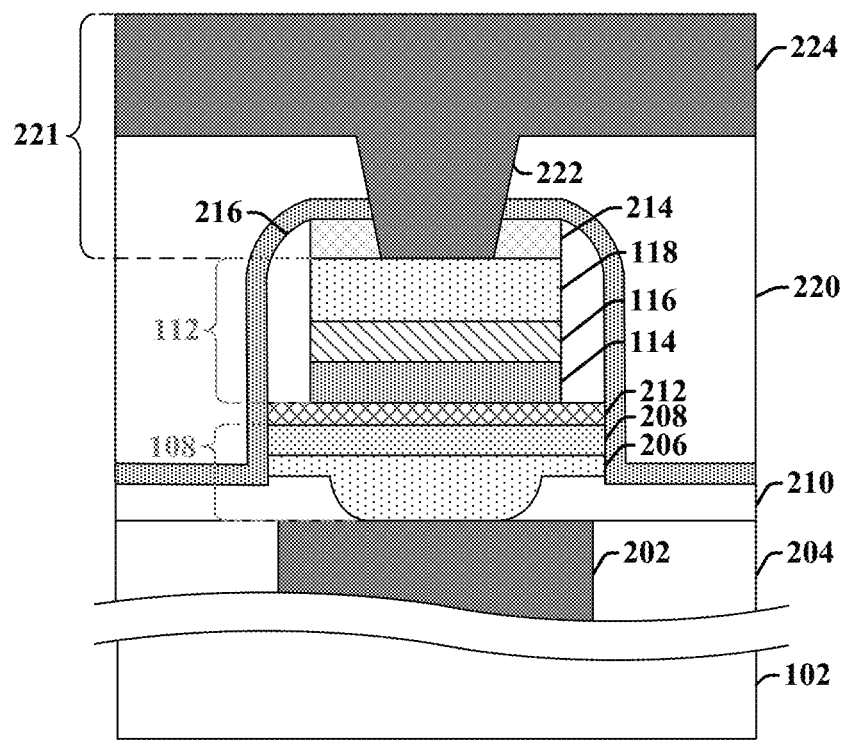

As shown in cross-sectional view 1500 of FIG. 15, an upper interconnect layer 221 is formed at a position abutting the multi-layer top electrode 112. In some embodiments, the upper interconnect layer 221 comprises an upper metal via 222 and an upper metal wire 224. In some embodiments, the upper interconnect layer 221 may be formed by etching the upper ILD layer 220 to form an opening that extends through the upper dielectric layer 218 and the masking layer 214 to the multi-layer top electrode 112. The opening is then filled with a metal (e.g., copper and/or aluminum) to form an upper metal via 222, which extends from a top surface of the multi-layer top electrode 112 to the upper metal wire 224.

Figure 16:
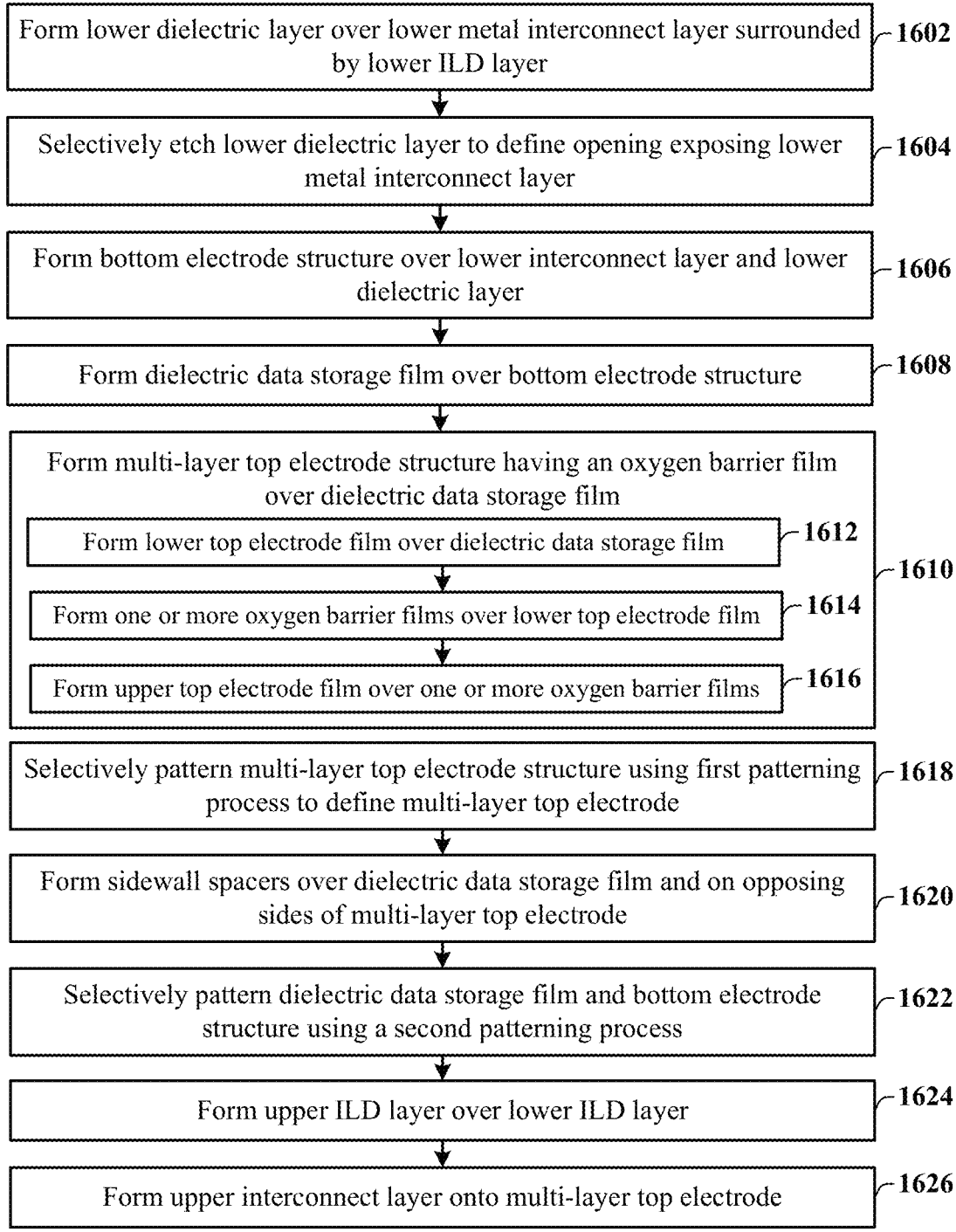
FIG. 16 illustrates a flow diagram of some alternative embodiments of a method of forming a RRAM device having a multi-layer top electrode comprising an oxygen barrier structure.

FIG. 16 illustrates a flow diagram of some embodiments of a method 1600 of forming a RRAM device having an oxygen barrier structure configured to mitigate movement of oxygen. While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a lower dielectric layer is formed over a lower interconnect layer surrounded by a lower inter-level dielectric (ILD) layer disposed over a semiconductor substrate. FIG. 6 illustrates some embodiments of a cross-sectional view 600 corresponding to act 1602.

At 1604, the lower dielectric layer is selectively etched to define an opening that extends through the lower dielectric layer to expose the lower interconnect layer. FIG. 7 illustrates some embodiments of a cross-sectional view 700 corresponding to act 1604.

At 1606, a bottom electrode structure is formed over the lower interconnect layer and the lower dielectric layer. FIG. 8 illustrates some embodiments of a cross-sectional view 800 corresponding to act 1606.

At 1608, a dielectric data storage film is formed over the bottom electrode structure. FIG. 9 illustrates some embodiments of a cross-sectional view 900 corresponding to act 1608.

At 1610, a multi-layer top electrode structure having one or more oxygen barrier films is formed over the dielectric data storage film. The one or more oxygen barrier films are configured to mitigate the movement of oxygen (e.g., oxygen ions). FIGS. 10A-10B illustrate some embodiments of cross-sectional views corresponding to act 1610.

In some embodiments, the multi-layer top electrode structure may be formed according to acts 1612-1616. At 1612, a lower top electrode film is formed over the dielectric data storage film. At 1614, one or more oxygen barrier films are formed over the lower top electrode film. At 1616, an upper top electrode film is formed over the one or more oxygen barrier films.

At 1618, the multi-layer top electrode structure is selectively patterned using a first patterning process is performed to define a multi-layer top electrode. FIG. 11 illustrates some embodiments of a cross-sectional view 1100 corresponding to act 1618.

At 1620, sidewall spacers are formed over the dielectric data storage film and on opposing sides of the multi-layer top electrode. FIG. 12 illustrates some embodiments of a cross-sectional view 1200 corresponding to act 1620.

At 1622, the dielectric data storage film and bottom electrode structure are selectively patterned using a second patterning process to define a dielectric data storage layer and a bottom electrode. FIG. 13 illustrates some embodiments of a cross-sectional view 1300 corresponding to act 1622.

At 1624, an upper inter-level dielectric (ILD) layer is formed over the lower ILD layer. FIG. 14 illustrates some embodiments of a cross-sectional view 1400 corresponding to act 1626.

At 1626, an upper interconnect layer is formed onto the multi-layer top electrode. FIG. 15 illustrates some embodiments of a cross-sectional view 1500 corresponding to act 1626.

Therefore, the present disclosure relates to a resistive random access memory (RRAM) device having an electrode comprising an oxygen barrier structure, which is configured to improve RRAM reliability by mitigating oxygen movement and thereby maintaining oxygen within close proximity of a dielectric data storage layer, and an associated method of formation.

In some embodiments, the present disclosure relates to a resistive random access memory (RRAM) device. The RRAM device comprises a bottom electrode disposed over a lower interconnect layer surrounded by a lower inter-level dielectric (ILD) layer. A dielectric data storage layer having a variable resistance is arranged over the bottom electrode, and a multi-layer top electrode is disposed over the dielectric data storage layer. The multi-layer top electrode comprises conductive top electrode layers separated by an oxygen barrier structure configured to mitigate movement of oxygen within the multi-layer top electrode.

In other embodiments, the present disclosure relates to a resistive random access memory (RRAM) device. The RRAM device comprises a bottom electrode disposed over a lower interconnect layer surrounded by a lower inter-level dielectric (ILD) layer. A dielectric data storage layer having a variable resistance is arranged over the bottom electrode. A lower top electrode layer is arranged over the dielectric data storage layer and comprises a metal. An oxygen barrier structure is arranged over the lower top electrode layer and comprises one or more of a metal oxide layer and a metal oxynitride layer. An upper top electrode layer is arranged over the oxygen barrier structure and comprises a metal nitride.

In yet other embodiments, the present disclosure relates to a method of forming a resistive random access memory (RRAM) device. The method comprises forming one or more bottom electrode films over a lower interconnect layer comprised within a lower inter-level dielectric (ILD) layer. The method further comprises forming a dielectric data storage film having a variable resistance above the one or more bottom electrode films. The method further comprises forming a lower top electrode film comprising a metal over the dielectric data storage film, forming one or more oxygen barrier films over the lower top electrode film, and forming an upper top electrode film comprising a metal nitride over the one or more oxygen barrier films. The one or more oxygen barrier films comprise one or more metal of a metal oxide film and a metal oxynitride film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, although the disclosure describes the oxygen barrier layer as being within a multi-layer top electrode, it will be appreciated that the oxygen barrier layer is not limited to the top electrode. Rather, the oxygen barrier layer may also or alternatively be present in a multi-layer bottom electrode.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive random access memory (RRAM) device, comprising:
   a bottom electrode disposed over a lower interconnect layer that is surrounded by a lower inter-level dielectric (ILD) layer;
   a data storage structure arranged over the bottom electrode;
   a multi-layer top electrode disposed over the data storage structure, wherein the multi-layer top electrode comprises conductive top electrode layers separated by an oxygen barrier structure that is configured to mitigate movement of oxygen between the conductive top electrode layers;
   a sidewall spacer disposed directly over the bottom electrode and having a sidewall that covers outermost sidewalls of the conductive top electrode layers and the oxygen barrier structure; and
   wherein the multi-layer top electrode has a gradient oxygen concentration profile that decreases as a distance from the data storage structure increases, an entirety of the gradient oxygen concentration profile within the multi-layer top electrode decreases over a first height that is different than a second height of the oxygen barrier structure.

2. The RRAM device of claim 1,
   wherein the sidewall of the sidewall spacer directly contacts the outermost sidewalls of the conductive top electrode layers and the oxygen barrier structure; and
   wherein a bottom surface of the sidewall spacer directly contacts an upper surface of the data storage structure.

3. The RRAM device of claim 1, wherein the multi-layer top electrode comprises:
   a lower top electrode layer arranged over the data storage structure, wherein the lower top electrode layer separates the data storage structure from the oxygen barrier structure; and
   an upper top electrode layer arranged over the lower top electrode layer, wherein the oxygen barrier structure has a bottom surface contacting the lower top electrode layer and an upper surface contacting the upper top electrode layer.

4. The RRAM device of claim 3, wherein the oxygen barrier structure comprises indium tin oxide.

5. The RRAM device of claim 3, wherein the oxygen barrier structure comprises a plurality of different metal oxides stacked onto one another, a plurality of different metal oxynitrides stacked onto one another, or a plurality of different metal oxides and metal oxynitrides stacked onto one another.

6. The RRAM device of claim 5, wherein the plurality of different metal oxides, the plurality of different metal oxynitrides, or the plurality of different metal oxides and metal oxynitrides within the oxygen barrier structure respectively completely cover an upper surface of an underlying layer.

7. The RRAM device of claim 1, wherein the gradient oxygen concentration profile monotonically decreases as the distance from the data storage structure increases.

8. The RRAM device of claim 1, wherein the multi-layer top electrode has a first oxygen concentration along a bottom surface of the oxygen barrier structure that faces the data storage structure and a second oxygen concentration along a top surface of the oxygen barrier structure that faces away from the data storage structure, the first oxygen concentration larger than the second oxygen concentration.

9. The RRAM device of claim 1, wherein the gradient oxygen concentration profile extends into an upper top electrode layer of the multi-layer top electrode, the upper top electrode layer separated from the data storage structure by the oxygen barrier structure.

10. The RRAM device of claim 1, further comprising:
    a protective layer disposed over the sidewall spacer and the multi-layer top electrode; and
    an upper ILD layer disposed over and laterally surrounding the protective layer.

11. A resistive random access memory (RRAM) device, comprising:
    a bottom electrode disposed over a lower interconnect layer that is surrounded by a lower inter-level dielectric (ILD) layer;
    a data storage structure arranged over the bottom electrode;
    a lower top electrode layer arranged over the data storage structure and comprising a metal;
    an oxygen barrier structure disposed on the lower top electrode layer, wherein the oxygen barrier structure comprises a first non-zero oxygen concentration;
    an upper top electrode layer disposed on the oxygen barrier structure, wherein the upper top electrode layer has a second non-zero oxygen concentration along a lower surface facing the oxygen barrier structure; and
    wherein the oxygen barrier structure comprises a first gradient oxygen concentration profile that is continuous with the second non-zero oxygen concentration along the lower surface of the upper top electrode layer.

12. The RRAM device of claim 11, wherein the upper top electrode layer comprises a second gradient oxygen concentration profile that is continuous with the first gradient oxygen concentration profile.

13. The RRAM device of claim 11, further comprising:
a sidewall spacer disposed directly over the data storage structure and vertically extending from a first horizontal line extending along a bottom of the lower top electrode layer to a second horizontal line extending along a top of the upper top electrode layer.

14. The RRAM device of claim 13, wherein the sidewall spacer has a sidewall that directly contacts outermost sidewalls of the lower top electrode layer, the oxygen barrier structure, and the upper top electrode layer.

15. The RRAM device of claim 11, further comprising:
a capping layer comprising a metal oxide disposed between the data storage structure and the lower top electrode layer.

16. A resistive random access memory (RRAM) device, comprising:
a bottom electrode disposed over a lower interconnect layer surrounded by a lower inter-level dielectric (ILD) layer;
a data storage structure over the bottom electrode, the data storage structure having a variable resistance; and
a top electrode structure comprising an oxygen barrier structure between a lower top electrode layer and an upper top electrode layer, wherein the upper top electrode layer is separated from the data storage structure by the lower top electrode layer, and wherein the top electrode structure has an oxygen content with a gradient profile that decreases from a bottom surface of the oxygen barrier structure to within the upper top electrode layer.

17. The RRAM device of claim 16, wherein an oxygen concentration is higher along the bottom surface of the oxygen barrier structure than along a top surface of the oxygen barrier structure.

18. The RRAM device of claim 16, further comprising:
a sidewall spacer disposed directly over the bottom electrode and having a sidewall that directly contacts outermost sidewalls of the top electrode structure.

19. The RRAM device of claim 18, wherein the sidewall spacer has a curved outer sidewall facing away from the oxygen barrier structure.

20. The RRAM device of claim 11, wherein the upper top electrode layer comprises a metal oxynitride.

* * * * *